United States Patent [19]

Shaheen et al.

[11] E Re. 29,284

[45] Reissued June 28, 1977

[54] PROCESS FOR FORMING INTERCONNECTIONS IN A MULTILAYER CIRCUIT BOARD

[75] Inventors: Joseph M. Shaheen, La Habra; Leo J. Quintana, Anaheim, both of Calif.

[73] Assignee: Rockwell International Corporation, El Segundo, Calif.

[22] Filed: Nov. 6, 1970

[21] Appl. No.: 87,512

Related U.S. Patent Documents

Reissue of:

[64] Patent No.: 3,464,855
Issued: Sept. 2, 1969
Appl. No.: 577,438
Filed: Sept. 6, 1966

[52] U.S. Cl. ..... 204/15; 204/38 R; 427/259; 427/282; 427/264

[51] Int. Cl.[2] ..... C25D 5/02

[58] Field of Search ..... 204/38 R, 15, 38; 117/212, 217; 427/259, 282, 264

[56] References Cited

UNITED STATES PATENTS

| | | | |
|---|---|---|---|
| 2,728,693 | 12/1955 | Cado | 117/38 X |
| 2,966,429 | 12/1960 | Darrel et al. | 117/38 X |
| 3,188,251 | 6/1965 | Straight et al. | 117/38 X |
| 3,226,255 | 12/1965 | Cieniewicz et al. | 117/38 X |
| 3,310,432 | 3/1967 | Griest et al. | 117/38 X |
| 3,496,072 | 2/1970 | Meyers | 204/15 |

*Primary Examiner*—R. L. Andrews
*Attorney, Agent, or Firm*—H. Fredrick Hamann; G. Donald Weber, Jr.

[57] ABSTRACT

Electronic interconnections are formed between a plurality of layers of multilayer board by first applying a removable and reuseable dielectric mask over the surface of a circuit pattern formed on an insulating layer. The mask includes a pattern of openings which define locations for forming interconnecting members between portions of said circuit pattern and a subsequently formed circuit pattern. After the openings have been filled, the removable mask is replaced by a permanent insulating layer. The process of applying the mask and filling the openings is repeated to produce a multilayer board having a plurality of layers.

3 Claims, 11 Drawing Figures

Figure 1:
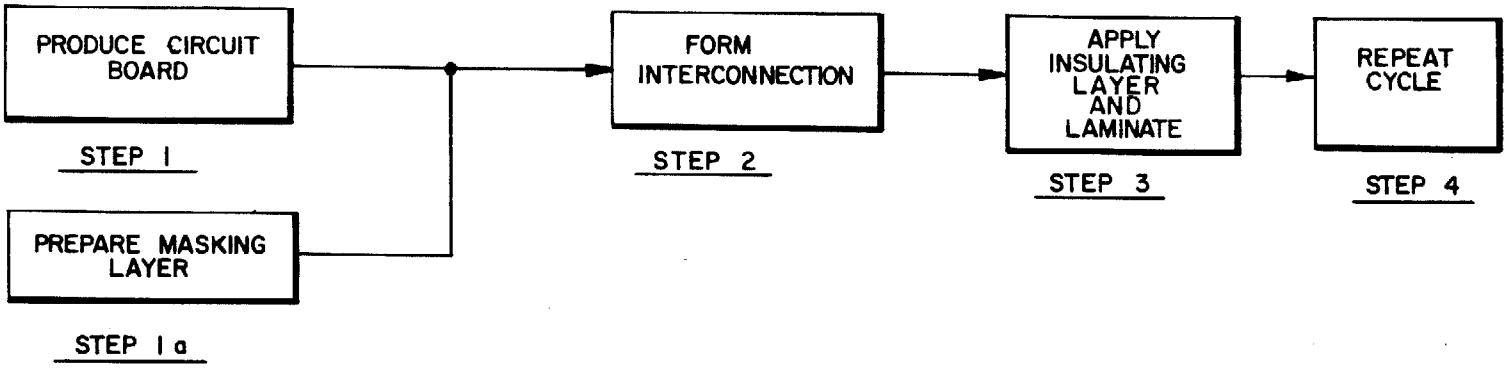

INVENTORS
JOSEPH M. SHAHEEN
LEO J. QUINTANA
BY Robert G. Rogers
ATTORNEY

INVENTORS
JOSEPH M. SHAHEEN
LEO J. QUINTANA
BY
Robert G. Rogers
ATTORNEY

INVENTORS
JOSEPH M. SHAHEEN
LEO J. QUINTANA
BY Robert G. Rogers
ATTORNEY

INVENTORS
JOSEPH M. SHAHEEN
LEO J. QUINTANA
BY Robert G. Rogers
ATTORNEY

INVENTORS
JOSEPH M. SHAHEEN
LEO J. QUINTANA
BY Robert G. Rogers
ATTORNEY

PROCESS FOR FORMING INTERCONNECTIONS IN A MULTILAYER CIRCUIT BOARD

Matter enclosed in heavy brackets [ ] appears in the original patent but forms no part of this reissue specification; matter printed in italics indicates the additions made by reissue.

This invention relates to a process for forming electrical interconnections between circuits comprising a multilayer board and, more particularly, to a process using a removable mask in forming a pattern of solid metal members for making electrical interconnections between such circuits.

One present method of forming electrical connections in a multilayer board utilizes a photo-resist layer which is processed for exposing the surface of a circuit board at locations where electrical interconnections are desired. A conducting material is deposited onto the exposed areas. Inasmuch as a photo-resist layer is ordinarily no thicker than one-thousandths of an inch and because interconnections of between five and ten thousandths of an inch may be required, the photo-resist process must be repeated several times until the desired height is achieved.

Another process for forming electrical interconnections is described in Patent No. 3,311,966 issued Apr. 4, 1967 having the title of "Method of Fabricating Multilayer Printed Wiring Boards." That process generally comprises chemically etching holes in a dielectric material sandwiched between conducting layers which are subsequently etched to form a circuit pattern. The etched holes are filled with a conducting material which interconnects both sides of the circuit board. Additional dielectric layers are then placed over the initial combination and the process repeated until a multilayer board is formed.

Other processes such as the one described in Patent No. 3,077,511, utilize pre-formed solder material with insulating sheets and interconnecting sheets for providing interconnections between circuits of a multilayer board. However, the thickness of the board is increased by the use of the additional sheets and the density may be reduced because of the plurality of conductors integrally formed with the interconnecting sheet. The plurality of conductors are used regardless of the number of interconnections between the layers.

Applicant's process overcomes many of the objections to the referenced processes by filing openings provided in an adherable and removable dielectric masking layer with a conducting metal. The mask is placed on a circuit board so that the openings mate with portions of the circuit to which interconnections are to be formed. The filled openings from conductive members for connecting to other circuit layers subsequently formed.

Subsequent to forming the conductive members, the board is processed to form an insulating layer over the circuit board surface and around the members, leaving only the top surfaces of the members exposed for connection to subsequent layers.

Therefore, it is an object of this invention to provide a process for forming solid metal interconnections between circuits of a multilayer board by use of a removable mask.

It is still another object of this invention to form conducting interconnections for one circuit of the multilayer board to another circuit without the necessity for making a series of the depositions in order to form the interconnecting members.

It is still a further object of this invention to provide a process for forming interconnections within a multilayer board by forming solid members to which circuits of a different layer are connected.

Still a further object of this invention is to provide a process for achieving high interconnection density by using a mask which defines a pattern of multilayer interconnections.

A still further object of this invention is to provide for increased flexibility and reliability in making interconnections between circuits of a multilayer board.

These and other objects of this invention will become more apparent in connection with the following drawings of which, FIG. 1 is a block diagram representation of the process steps utilized in forming multilayer interconnections.

FIGS. 2(a) through 2(j) represent one embodiment of a multilayer board during various phases of fabrication.

Referring now to FIG. 1 wherein is shown a general sequence of steps comprising the process for forming interconnections between circuits.

In step 1 a circuit board comprised of a circuit pattern on one or both sides of a dielectric layer is produced. In the usual embodiment, the circuit is formed by etching a conducting material such as copper into a desired pattern of conductors and terminal areas. Electrical connections may be between the circuit patterns on both sides of the board by electro-plating openings through the dielectric with a conducting material.

In step 1(a) a masking layer is prepared for covering areas of the circuit pattern where interconnections to subsequently formed circuit patterns are not desired. In other words, the mask comprises a dielectric material such as epoxy glass which has a pattern of openings therethrough for exposing the portion of the circuit pattern to which interconnections are to be affixed. The openings are filled with a conducting material such as copper in subsequent steps.

The sequence for producing the circuit board and the mask is not important. Either one may be formed before the other or both may be formed simultaneously.

In step number 2 the mask, which may have, for example, a pressure sensitive adhesive attached to the side thereof adjacent to the circuit pattern, is mated with the pattern so that the mask openings correspond with areas of the circuit pattern which are to be interconnected to other patterns.

Means may be provided for filling the plurality of openings simultaneously with the conducting material. For example, if an electro deposition process is used, the entire surface is coated with a thin conducting layer such as copper which functions as an electrode for all the mask openings. The layer is deposited on the surface prior to affixing the mask and in a specific embodiment is continuous over the circuit board surfaces.

In other embodiments the circuit may be masked so that the layer contacts the edge of the circuit but does not cover it. The conducting layer could also be formed so that it covers or contacts only the portions of the pattern to which depositions are to be made. If the layer is omitted from the top surface of the pattern, a relatively improved bond between the pattern and subsequent depositions may result.

When the mask is placed on the board, the openings are filled to the top surface of the mask with the conducting material. Afterwards, the mask and the continuity layer are removed, leaving only the circuit pattern and the protruding interconnections.

In step number 3, an insulation layer similar to the mask, is fabricated having a pattern of openings which mate with the interconnections formed in step number 2. It has a thickness compatible with the height of the interconnecting members so that the top surface of the layer and the tops of the protrusions are in the same plane. The insulating layer may be fabricated at the same time as the mask, and is laminated to the circuit board following its disposition thereon.

In other embodiments, in lieu of forming the insulating layer, an insulating material such as uncured epoxy resin could be spread over the surface of the circuit board until the material is flush with the top surfaces of the interconnections.

Subsequently, the cycle is repeated until as many layers as are needed to complete the multilayer board are fabricated.

Figure 2A:
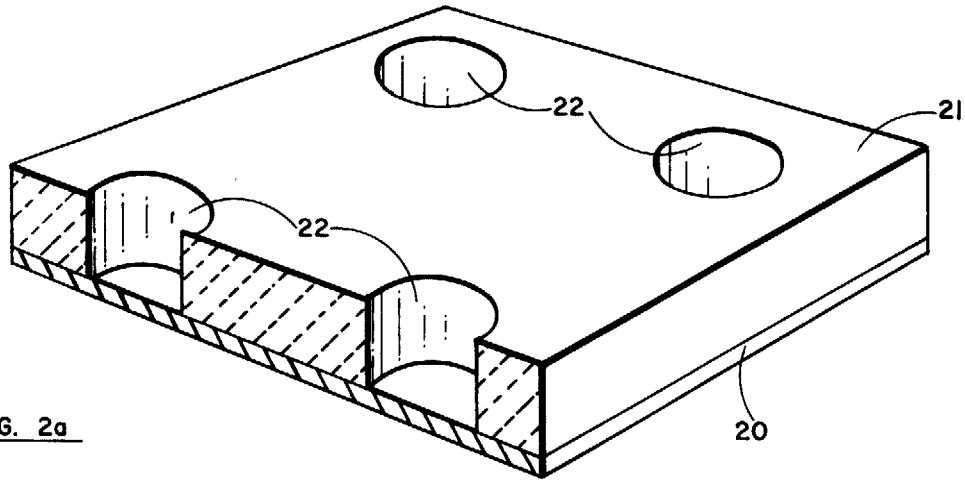

Referring now to FIG. 2(a), wherein is shown a cross-sectional view of layer 21 having a pattern of openings 22 produced through the layer. In a preferred embodiment, the layer is comprised of a dielectric material such as an epoxy glass resin. A conducting layer 20 such as copper is shown as bonded to one surface of layer 21. In other embodiments, a conducting layer could be provided for both surfaces. In either embodiment, after the openings are filled and a circuit pattern produced on both sides of the board, both sides of the board may be processed simultaneously.

Various methods may be used to produce the pattern of openings in layer 21. For example, an epoxy glass layer ranging in thickness from .004 to .015 inch may be either mechanically or chemically drilled.

One etchant suitable for etching a conducting layer of copper is $FeCl_3$ and an etchant for drilling the epoxy glass is a solution comprising HF and $H_2SO_4$.

Figure 2B:
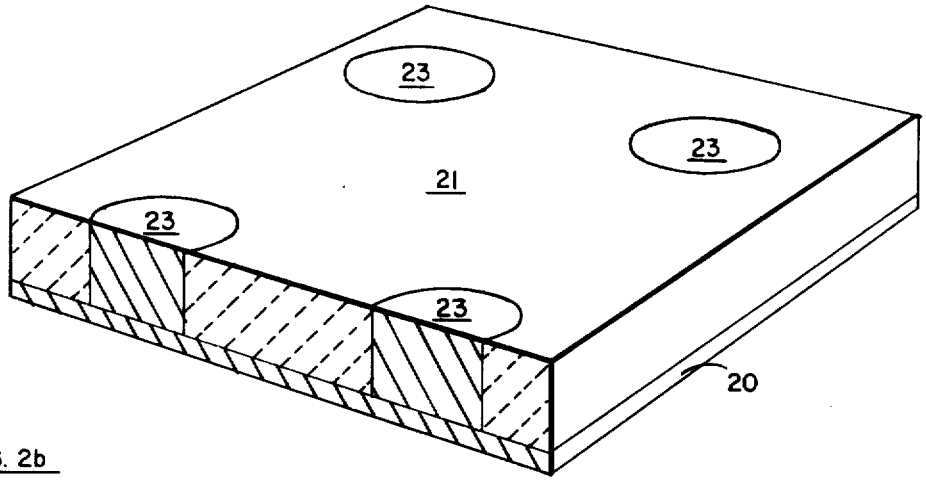

After the openings are formed through layer 21, a conducting material 23, such as copper, is provided in the openings as shown in FIG. 2(b). The conducting material is made level with the top surface of the dielectric by, for example, depositing copper therein from an electro-plating copper bath.

In another example, the openings may be filled by forcing a liquid gallium alloy therein and subsequently hardening the material.

Figure 2C:
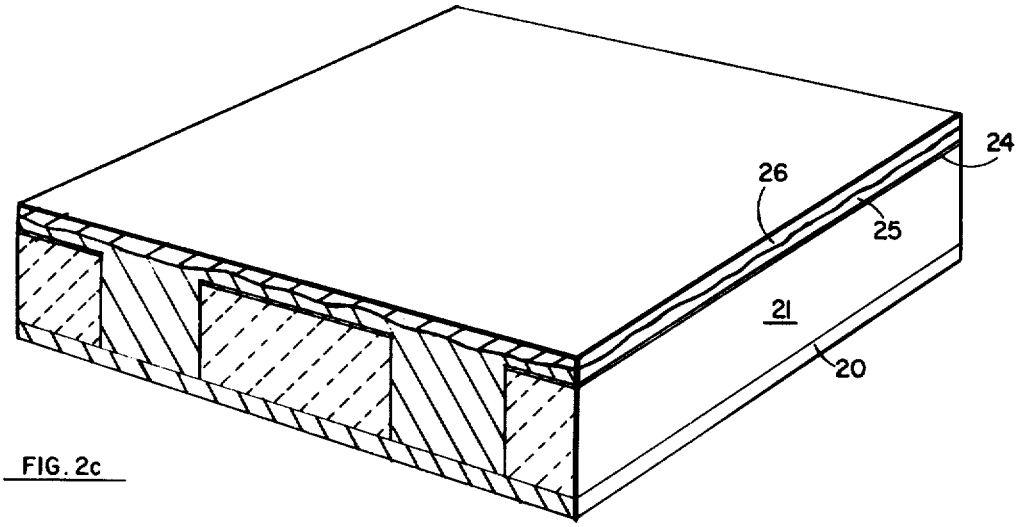

In FIG. 2(c) the surface of the dielectric is coated with a conducting layer such as copper or nickel, having an approximate thickness of one thousandths of an inch. In one embodiment, the surface is first electroless copper plate to form layer 25 and then electro-plated with copper to form layer 26.

If the copper does not readily adhere to the dielectric, the surface may be coated with adhesive layer 24 to insure good contact between the copper layer and the board surface. An adhesive such as B-staged epoxy may be used for that purpose. In other processes, sensitizers known to those skilled in the art may be used.

Figure 2D:
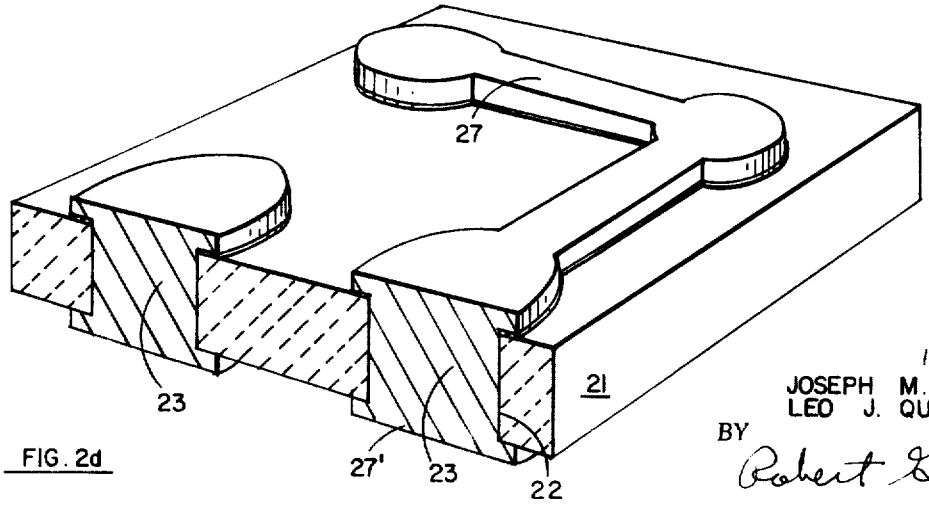
Figure 2E:
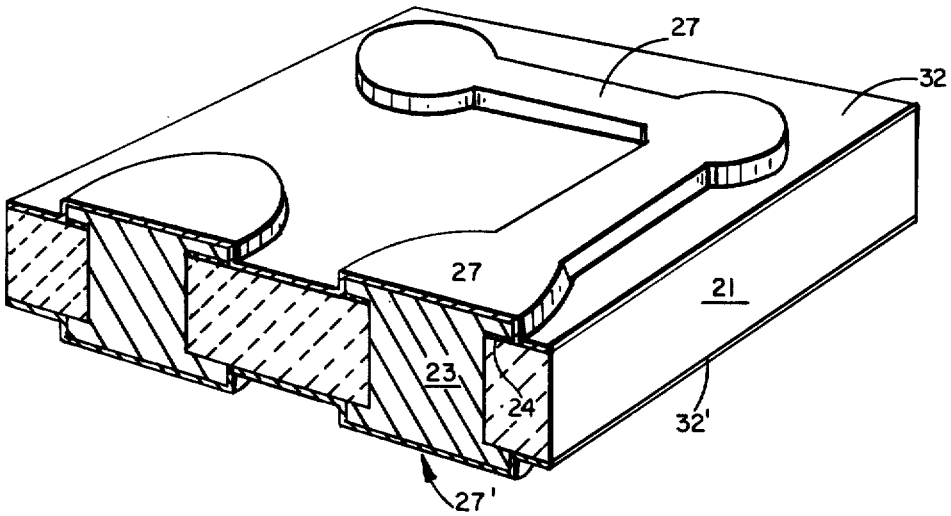

In the next step, shown in FIG. 2(d) both surfaces (20 and 26 of FIG. 2(c)) are coated with a photosensitive material and exposed to ultraviolet radiation to form circuit patterns on both sides of the board. The unexposed portions of the material are washed away leaving the copper layer covered by the exposed portions. The copper material not covered is etched away to form circuit patterns 27 and 27′ on the board's surfaces. The two patterns are interconnected through the conducting material filling openings 22. After the etching is completed, the remaining photo-sensitive material is removed from the top of the circuit pattern. The adhesive may also be removed at that time.

In lieu of using a deposition process, followed by an etching process, a circuit pattern could be printed on by using silk screen method or other methods known in the art.

Conducting means may be disposed on the surface of the board for providing an electrode connection to at least the portions of the circuit pattern to which interconnections are to be made. For example, a thin layer of copper may be flash plated on the surfaces followed by an electro-plated copper deposit for approximately one minute to provide the electrical continuity necessary to complete the process. The board is shown with continuity layers 32 and 32′ in FIG. 2(e).

Figure 2F:
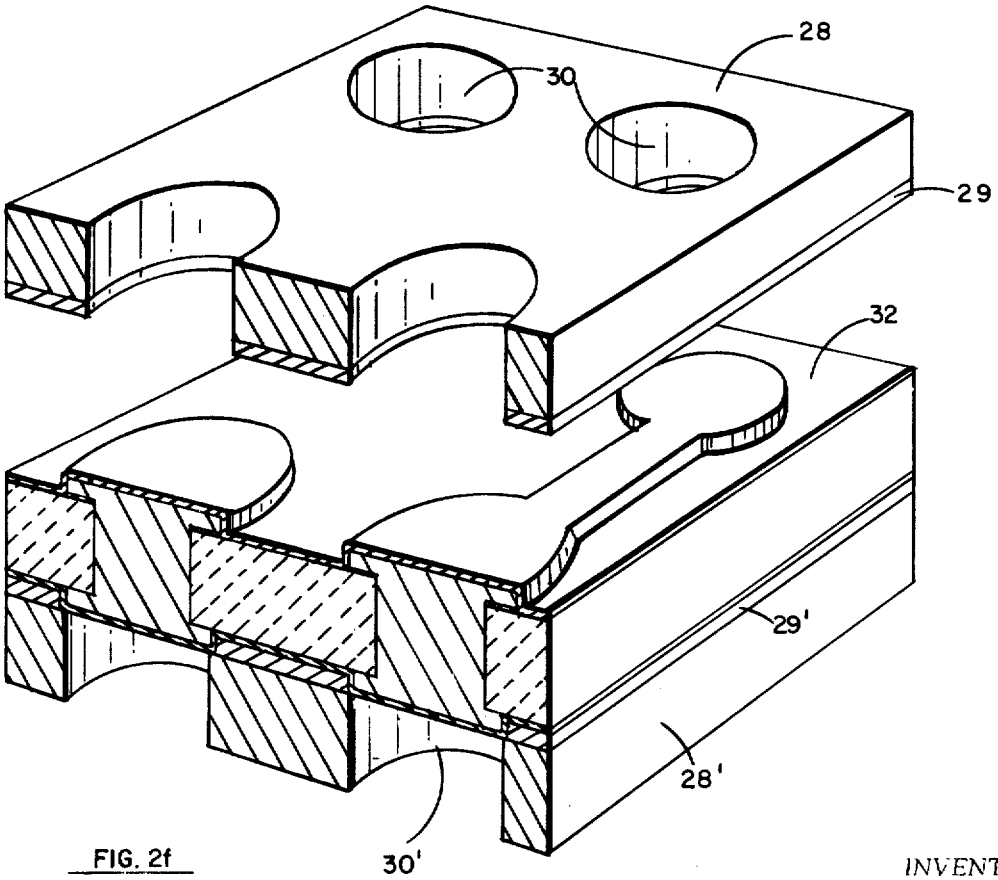
Figure 2G:
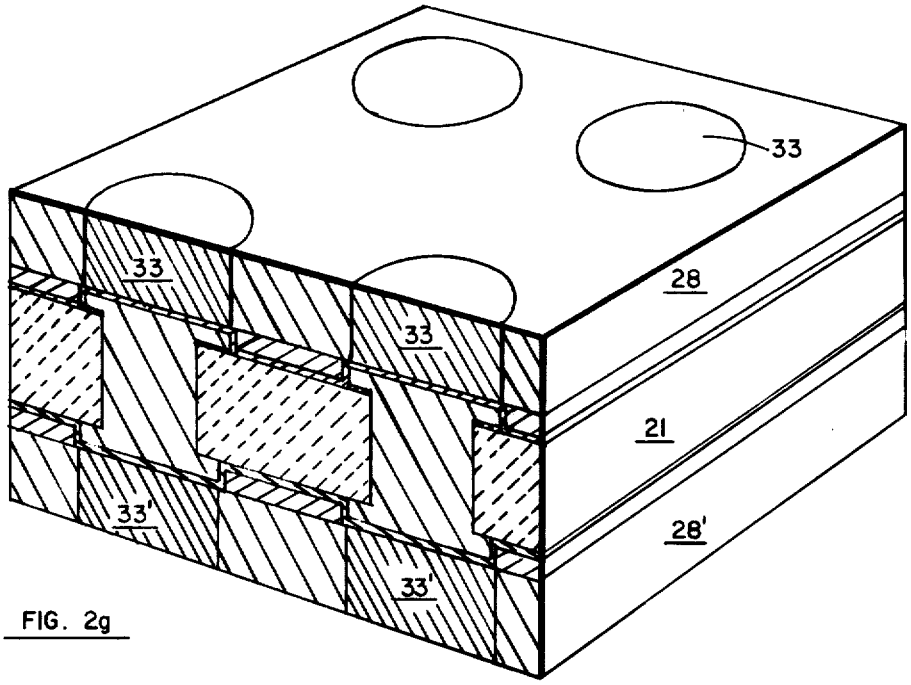

Electrical continuity may be important because as shown in FIGS. 2(f) and 2(g) the interconnecting members can be formed simultaneously by making a single electrode connection to the layer. An electrode connection could be provided for each opening, however. In addition, a conducting sheet or plate with openings matching the circuit pattern may be disposed over the surface as an electrode.

Masks 28 and 28′ have pressure sensitive adhesive layers 29 and 29′ coated on the surfaces thereof adjacent to the circuit board surfaces. The mask is pressed against the board surface.

The mask may be produced in the same manner as described for layer 21. In certain embodiments, layer 21 may be identical to mask 28 except for the addition of the pressure sensitive adhesive layer 29. The adhesive may be sprayed onto the surface to a thickness of approximately .001 inch. It is desirable to limit the thickness to no more than is necessary to effect good adhesion between the mask and the board surface. Excessive amounts may be squeezed into the mask openings. In applying the adhesive, precaution must be taken to prevent the adhesive from entering the openings. In one embodiment air is directed through the openings during application of the adhesive to keep the openings 30 and 30′ cleared of the adhesive.

After the masks are properly placed on a circuit board and an electrical connection is made to each continuity layer, the assembly is immersed in an electro-plating copper bath until the openings are filled with copper to form members 33 and 33′ as shown in FIG. 2(g).

Figure 2H:
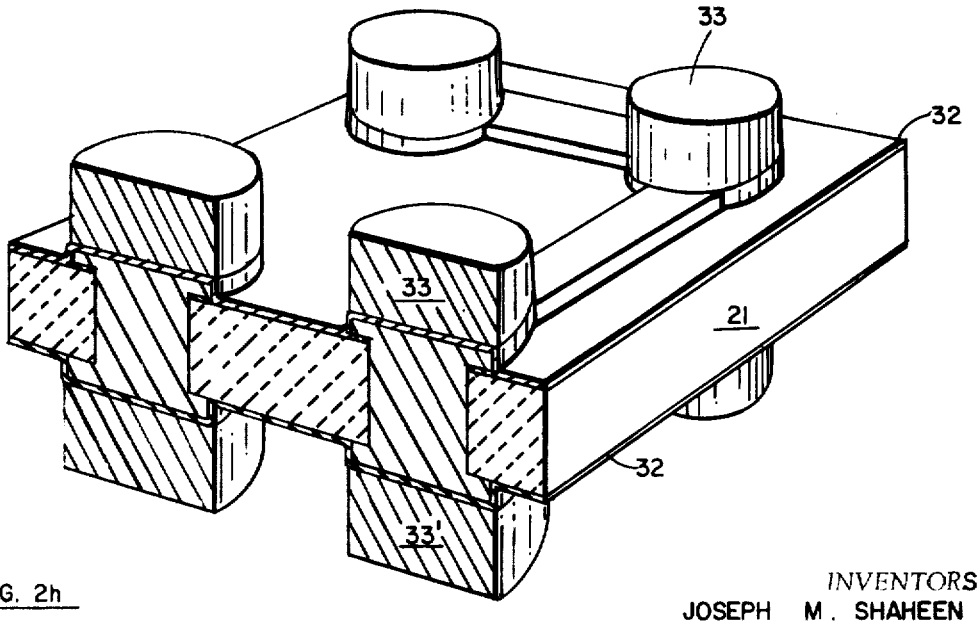

The masks are then removed as shown in FIG. 2(h) and the board surfaces cleaned with a solvent to remove the remaining adhesive.

Subsequently, the assembly is flash etched in a ferric chloride bath for approximately 15 to 20 seconds to remove the continuity layer from the areas of the circuit not comprising part of the circuit pattern. In other words, the layer is relatively thin so that the etchant removes the copper down to the dielectric material without etching away substantial portions of the copper comprising the circuit pattern and the electrical interconnections previously formed.

The board comprises circuit patterns with producing members 33 and 33′ for interconnecting with other patterns to be formed as part of the multilayer board.

Figure 2J:
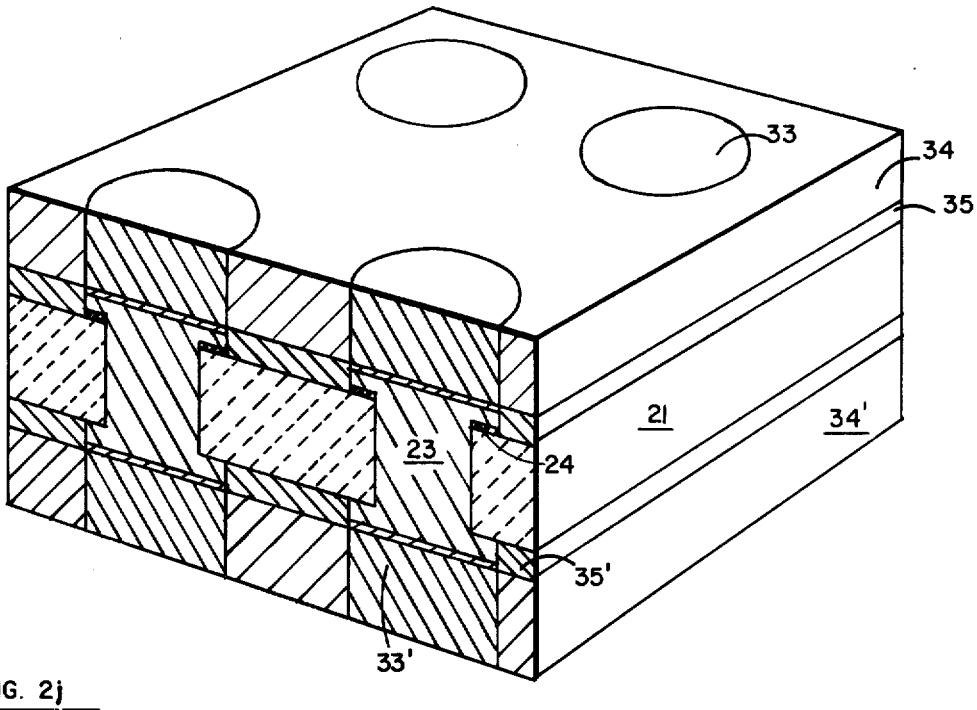
Figure 2I:
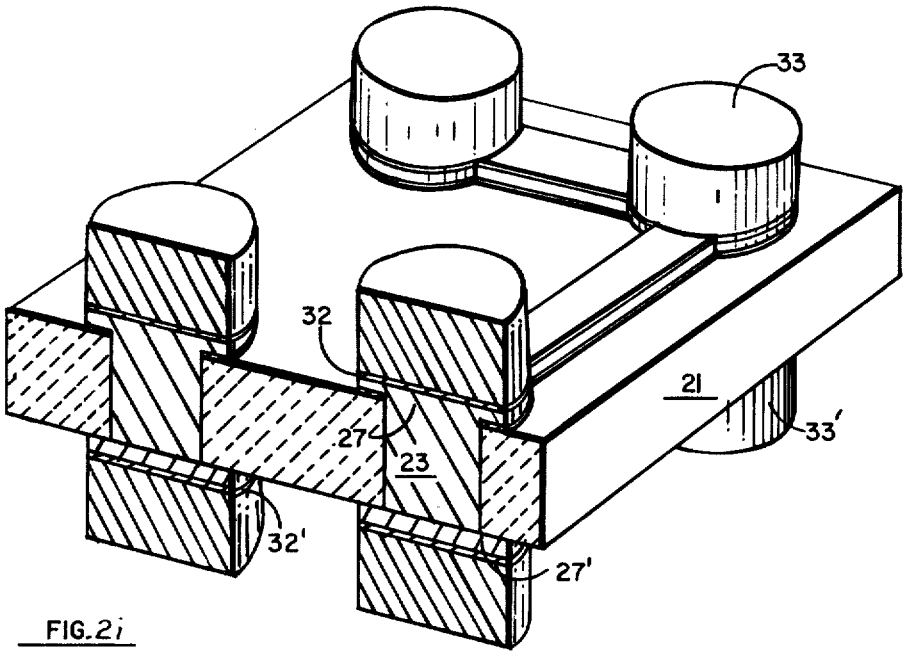

The board, after the etching is finished, is shown in FIG. 2(i).

In certain embodiments one or more of the members may not be connected to a subsequent layer but instead may be increased in height by a subsequent deposit to interconnect with a circuitry of another layer. This added feature reduces certain of the registration problems of the prior art and provides increase strength and reliability to the completed board.

Also, although four interconnecting members are shown, it should be obvious that more than the four or a plurality of patterns, could be fabricated by the process described herein.

Insulating layers 34 and 34' (shown in FIG. 2(j)), having a pattern of openings identical to the pattern of members, are coated with laminating adhesives 35 and 35' such as an epoxy adhesive and placed into position on the board. In the alternative, the adhesive could be sprayed directly onto the surface of the board and the insulating layers placed onto the applied adhesive. After the insulating layers are in place, the combination is pressed together and heated until it is cured.

The insulating layer may be formed at any time prior to its use, although in a preferred embodiment, it is formed at the time the mask and the dielectric layers are formed and in the same manner. In one embodiment, the removable masks may be cleaned and used as the insulating layers.

The completed board showing the insulated layers and the top surfaces of the interconnection members is shown in FIG. 2(j).

In another embodiment, the insulating layers could be applied by spraying on an uncured epoxy until the material is flush with the top surfaces of the interconnecting members. After application of the epoxy, it is cured.

If additional layers are required the process as described beginning with FIG. 2(a) is repeated until as many layers as are desired have been fabricated.

Although the invention has been described and illustrated in detail, it is to be understood that the same is by way of illustration and example only, and is not to be taken by way of limitation; the spirit and scope of this invention being limited only by the terms of the appended claims.

We claim:

1. A process for forming electrical connections between circuit layers of a multilayer board, said process comprising the steps of, producing a circuit pattern on at least one surface of an insulating substrate, covering said circuit pattern and said one surface with a thin conducting layer, disposing a reusable mask over said thin conducting layer, said mask having a pattern of openings defining locations for electrical connections to said circuit pattern, filling said openings with a conducting material to form conducting members on said circuit pattern, removing said reusable mask and the portion of said thin conducting layer on said one surface, applying an insulating layer over the surface of said insulating substrate and around said conducting members, the surface of said insulating layer and the tops of said conducting members being in approximately the same plane, producing a second circuit pattern on the surface of said insulating layer, said circuit pattern having portions connected to at least certain of said conducting members.

2. The process as recited in claim 1, including the steps of, covering said second circuit pattern and the surface of said insulating layer with a second thin conducting layer, disposing said reusable mask over the surface of said second thin conducting layer, said mask having a pattern of openings defining locations for electrical connections to said second conductor pattern, filling said openings with a conducting material to form second conducting members on said second circuit pattern, removing said reusable mask and the portions of said second thin conducting layer on said insulating layer, applying an insulating layer on the surface of said first recited insulating layer and around said second conducting members, the surface of said second recited insulating layer and the tops of said second conducting members being in approximately the same plane, forming a third circuit pattern on the surface of said second recited insulating layer, said circuit pattern having portions connected to at least certain of said second conducting members.

*3. A method of fabricating an individual layer of a multilayer printed circuit board, comprising the steps of:*

*forming a printed circuit on an insulator substrate;*

*coating said printed circuit with a thin conductive layer of material;*

*conforming an apertured masking material to said conductive layer on said printed circuit on said insulator substrate;*

*said masking material including apertures therein in the desired pattern of at least one interlayer connector;*

*electroforming said connector using said conductive layer as an electrical path in the electroforming operation;*

*removing the masking material and the resultant exposed material of the conductive layer; and*

*insulating the printed circuit and the interlayer connector, leaving an exposed surface at the end of said interlayer connector.*

* * * * *